United States Patent
Shin et al.

(10) Patent No.: US 7,977,578 B2
(45) Date of Patent: ***Jul. 12, 2011

(54) TAB TAPE FOR TAPE CARRIER PACKAGE

(75) Inventors: Na-Rae Shin, Seoul (KR); Dong-Han Kim, Osan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/458,936

(22) Filed: Jul. 28, 2009

(65) Prior Publication Data

US 2010/0000767 A1 Jan. 7, 2010

Related U.S. Application Data

(63) Continuation of application No. 11/341,614, filed on Jan. 30, 2006, now Pat. No. 7,579,552.

(30) Foreign Application Priority Data

Aug. 12, 2005 (KR) .................................. 2005-74256

(51) Int. Cl.
*H05K 1/00* (2006.01)
(52) U.S. Cl. ........................................ 174/254; 174/260
(58) Field of Classification Search .................. 174/254, 174/261, 260
See application file for complete search history.

(56) References Cited

U.S. PATENT DOCUMENTS

| | | | |
|---|---|---|---|
| 4,109,096 A | 8/1978 | Dehaine | |
| 5,288,950 A | 2/1994 | Ushio et al. | |
| 5,309,316 A | 5/1994 | Yagi et al. | |
| 5,448,451 A * | 9/1995 | Takubo et al. | 361/749 |
| 5,661,338 A * | 8/1997 | Yoo et al. | 257/676 |
| 7,205,482 B2 | 4/2007 | Naito et al. | |
| 7,217,990 B2 * | 5/2007 | Chung | 257/668 |
| 7,433,008 B2 * | 10/2008 | Kim | 349/152 |

FOREIGN PATENT DOCUMENTS

| | | |
|---|---|---|
| JP | 09-321083 | 12/1997 |
| JP | 11-345839 | 12/1999 |
| JP | 2001-135676 | 5/2001 |
| KR | 100191078 B1 | 1/1999 |

* cited by examiner

*Primary Examiner* — Ishwarbhai B Patel
(74) *Attorney, Agent, or Firm* — Harness, Dickey & Pierce, P.L.C.

(57) ABSTRACT

A TAB tape for a tape carrier package may have at least one opening formed in a connection portion. The at least one opening may be provided in the connection portion and a portion of the corresponding second lead. The at least one opening may be arranged near a boundary between the corresponding first lead and the connection portion. The at least one opening may be sized to reduce the change of the lead width from the first lead to the second lead.

16 Claims, 12 Drawing Sheets

TAB TAPE FOR TAPE CARRIER PACKAGE

PRIORITY STATEMENT

This U.S. non-provisional application is a continuation of U.S. patent application Ser. No. 11/341,614, filed Jan. 30, 2006 now U.S. Pat. No. 7,579,552, which claims benefit of priority under 35 U.S.C. §119 from Korean Patent Application No. 2005-74256, filed on Aug. 12, 2005, the entire contents of which are incorporated herein by reference.

BACKGROUND

1. Field of the Invention

Example embodiments of the present invention may relate to a semiconductor device and, more particularly, to a tape automated boding (TAB) tape for a tape carrier package.

2. Description of the Related Art

A semiconductor chip may be mounted on a wiring substrate. A wiring substrate may include a tape carrier film. A tape carrier film may include a film tape and wiring patterns may be provided on the film tape.

A tape carrier film and a semiconductor chip mounted on the tape carrier film may be packaged to form a tape carrier package. The manufacture of a tape carrier package may involve a tape automated bonding (TAB) technique for connecting the semiconductor chip to the tape carrier package. A tape carrier film may be referred to as a TAB tape.

Figure 1:
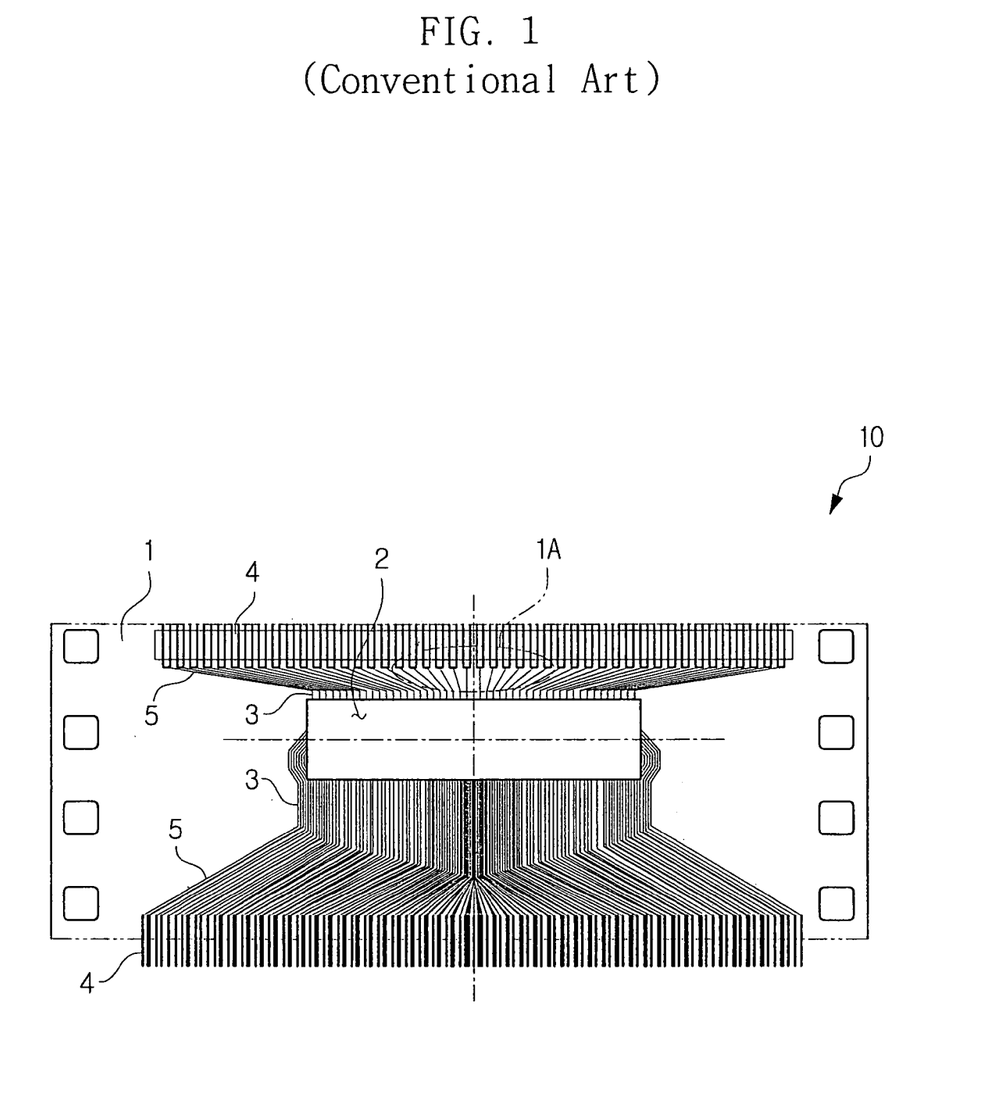
FIG. 1 is a plan view of a conventional TAB tape for a tape carrier package.

FIG. 1 is a plan view of a conventional TAB tape 10.

Referring to FIG. 1, the TAB tape 10 may include a base film 1. Wiring patterns may be provided on the base film 1. The base film 1 may be fabricated from an insulating material, for example a polyimide resin. The wiring patterns may be fabricated by providing a conductive film, for example a Cu film, on the base film 1 and patterning the conductive film by photo etching, for example.

The base film 1 may have a chip mounting area 2. The base film 1 may have sprocket holes arranged along opposing edges of the base film 1.

The wiring patterns may include first leads 3 and second leads 4. The first leads 3 may be electrically connected to a semiconductor chip using an inner lead bonding method (for example). The second leads 4 may be connected to terminals of an external substrate. As compared to the second leads 4, the first leads 3 may be provided at a smaller pitch, and thus may have smaller widths.

The wiring patterns may include input wiring patterns and output wiring patterns. The input wiring patterns may extend from one side of the chip mounting area 2. The output wiring patterns may extend from the other side of the chip mounting area 2. The quantity of the second leads of the output wiring patterns may be more than the quantity of the second leads of the input wiring patterns. The widths of the second leads of the input wiring patterns may be greater than the width of the second lead of the output wiring patterns.

Figure 1A:
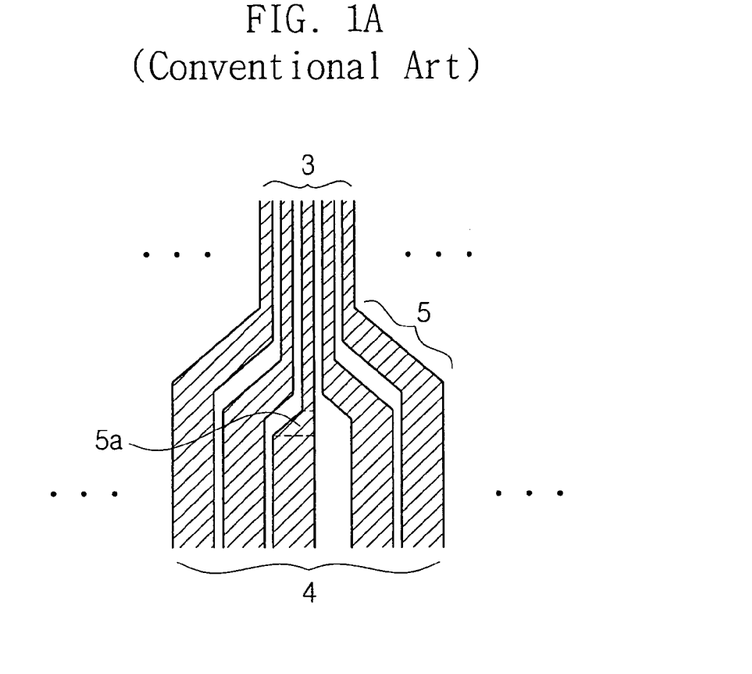
FIG. 1A is an enlarged plan view of section 1A in FIG. 1.

FIG. 1A is an enlarged plan view of section 1A in FIG. 1.

Referring to FIG. 1A, the wiring patterns may include connection portions 5 that may extend between the first leads 3 and the second leads 4. The connection portions 5 may provide a transition between the first leads 3 (which may be provided at a relatively small pitch) and the second leads 4 (which may be provided at a relatively large pitch). For example, the connection portions 5 may extend in an inclined fashion relative to the first and the second leads 3, 4, respectively.

The connection portions 5 may include a shortest connection portion 5a that may have the shortest length between the first and the second leads 3, 4, respectively. The shortest connection portion 5a may experience a change of width due to the difference in widths between the first lead 3 and the second lead 4.

A tape carrier package implementing a TAB tape may be tested. During testing processes, stresses from heat and/or mechanical shocks (for example) may be concentrated on the shortest connection portion 5a, which may damage and/or break the shortest connection portion 5a.

Attempts have been made to reduce the stress concentration phenomenon at the shortest connection portion. According to one conventional approach, and with reference to FIG. 2A, notches 6 may be provided in the shortest connection portions 5 to reduce the change of width of the shortest connection portions 5.

Figure 2A:
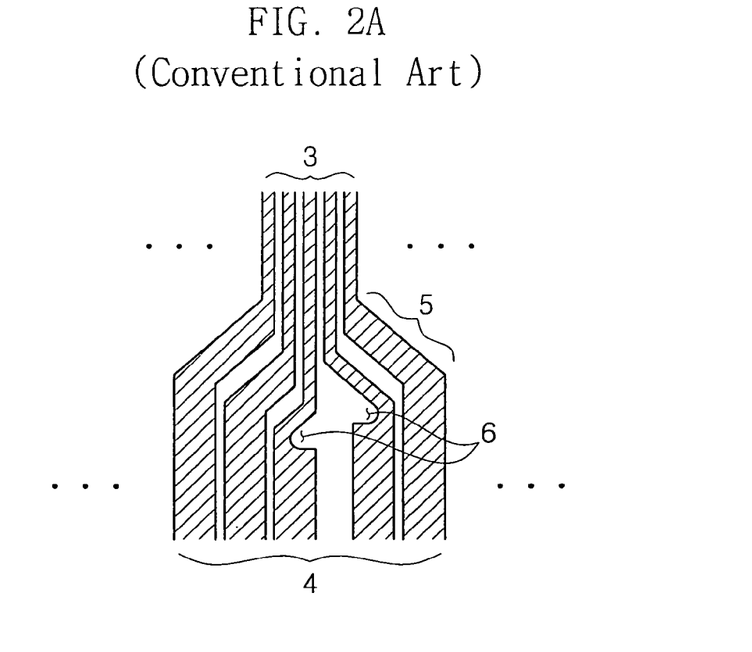
FIGS. 2A through 2C are enlarged plan views of conventional TAB tapes for tape carrier packages.

The notch 6 may dissipate stresses in a specific direction, but it may not dissipate stresses in different directions, and therefore the notch 6 may not reduce stresses due to mechanical shocks.

Figure 2B:
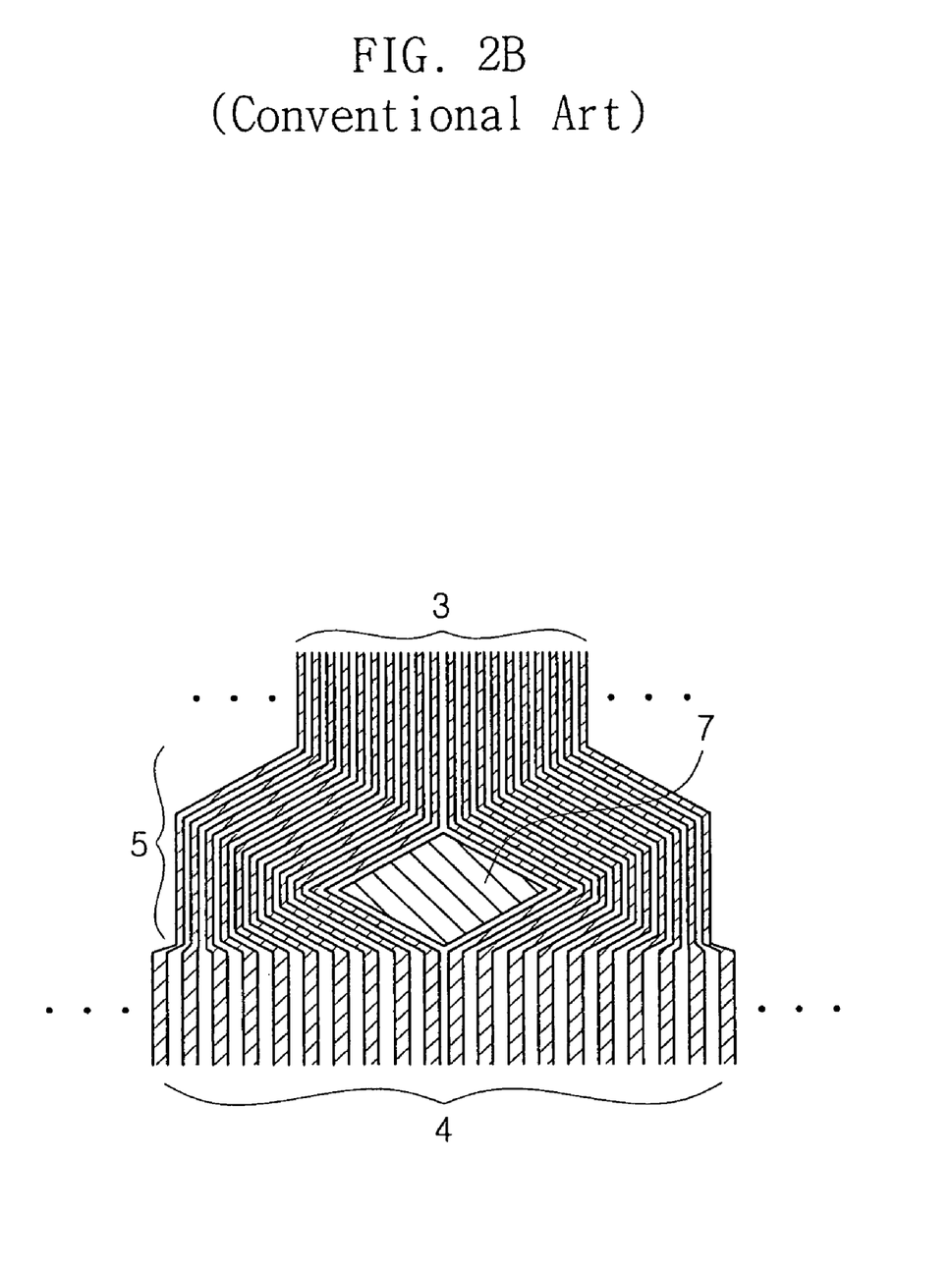

As shown in FIG. 2B, a dummy pattern 7, which may have a diamond shape, may be provided between a pair of shortest connection portions to extend the lengths of the shortest connection portions.

However, wiring patterns may be extended in length and/or size, which may enlarge the size of the TAB tape. Therefore, the size of a semiconductor device may not be reduced.

Figure 2C:
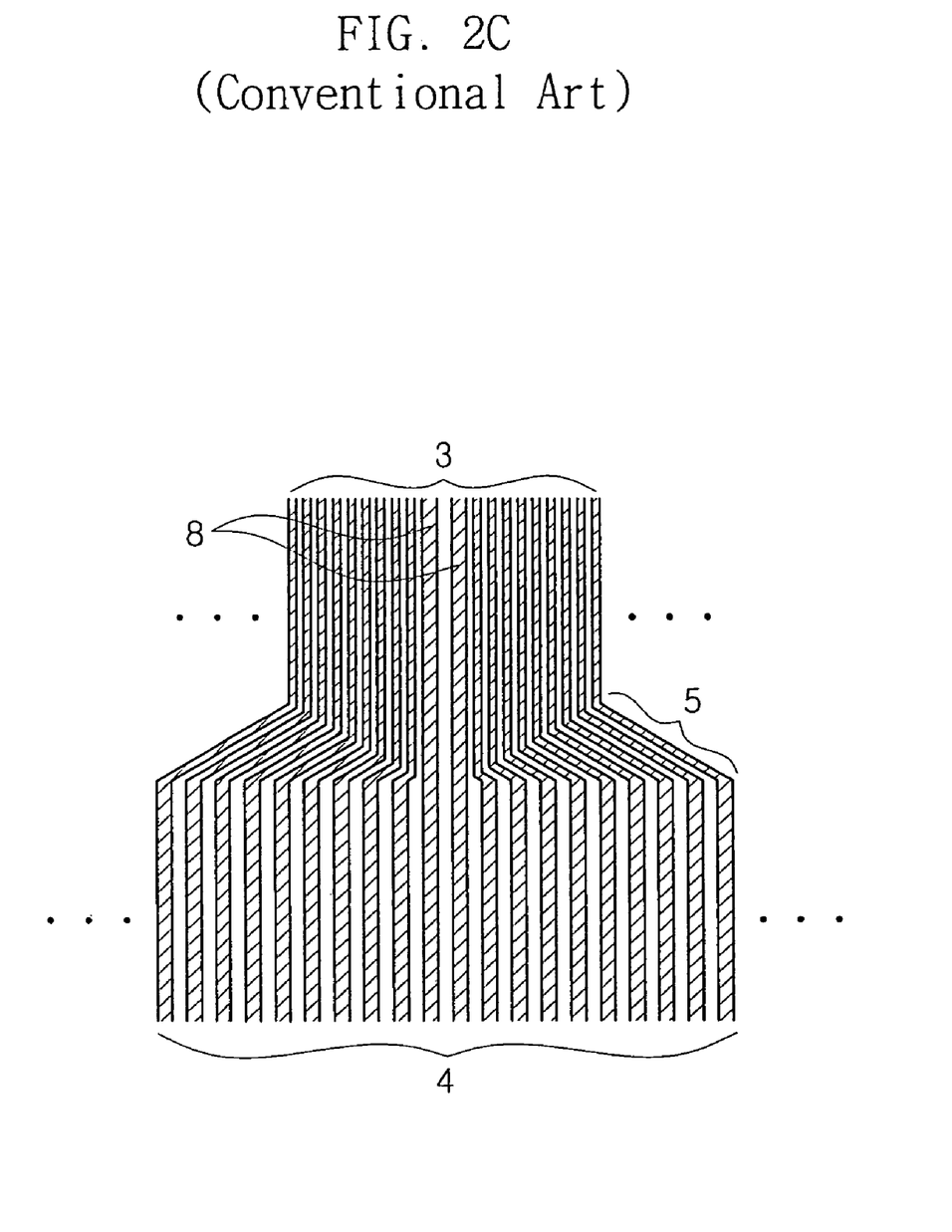

As shown in FIG. 2C, the widths of first leads 3, which may be connected to shortest connection portions, may be widened (as compared to the other first leads 3) in conformity with the widths of second leads 4, which may be connected to shortest connection portions. Here, wiring patterns may include width adjusted leads 8, which may reduce the integration and the pitch of a semiconductor chip.

SUMMARY

According to an example, non-limiting embodiment, a TAB tape may include a base film having a chip mounting area. Wiring patterns may be provided on the base film. The wiring patterns may include a plurality of first leads of a first width. A plurality of second leads of a second width, and a plurality of connection portions connect the first leads to the second leads. The connection portions may include a shortest connection portion. An opening may be provided in the shortest connection portion and a portion of the second lead connected to the shortest connection portion.

According to another example, non-limiting embodiment, a TAB tape may include a base film having a chip mounting area. Wiring patterns may be provided on the base film. The wiring patterns may include a plurality of first leads of a first width, a plurality of second leads of a second width, and a plurality of connection portions connecting the first leads to the second leads. The connection portions may include a pair of shortest connection portions. The shortest connection portions may be arranged on opposite sides of a center line that may be perpendicular to a major axis of the chip mounting area. Openings may be respectively provided in each of the shortest connection portions and a portion of each of the second leads connected to the shortest connection portions.

According to another example, non-limiting embodiment, a wiring substrate may include a base. A plurality of parallel first leads may be provided on the base at a first pitch. A plurality of parallel second leads may be provided on the base at a second pitch, which may be greater than the first pitch.

Connection portions may connect together the first and the second leads. An opening may be provided in a shortest one of the connection portions.

BRIEF DESCRIPTION OF THE DRAWINGS

Example, non-limiting embodiments of the present invention will be readily understood with reference to the following detailed description thereof provided in conjunction with the accompanying drawings, wherein like reference numerals designate like structural elements.

The drawings are provided for illustrative purposes only and are not drawn to scale. The spatial relationships and relative sizing of the elements illustrated in the various embodiments may be reduced, expanded and/or rearranged to improve the clarity of the figure with respect to the corresponding description. The figures, therefore, should not be interpreted as accurately reflecting the relative sizing or positioning of the corresponding structural elements that could be encompassed by an actual device manufactured according to example embodiments of the invention.

DETAILED DESCRIPTION OF EXAMPLE NON-LIMITING EMBODIMENTS

Example, non-limiting embodiments of the present invention will be described with reference to the accompanying drawings. This invention may, however, be embodied in many different forms and should not be construed as limited to example embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

well-known structures and processes are not described or illustrated in detail to avoid obscuring the present invention.

An element is considered as being mounted (or provided) "on" another element when mounted or provided) either directly on the referenced element or mounted (or provided) on other elements overlaying the referenced element. Throughout this disclosure, spatial terms such as "upper," "lower," "above" and "below" (for example) are used for convenience in describing various elements or portions or regions of the elements as shown in the figures. These terms do not, however, require that the structure be maintained in any particular orientation.

Figure 3:
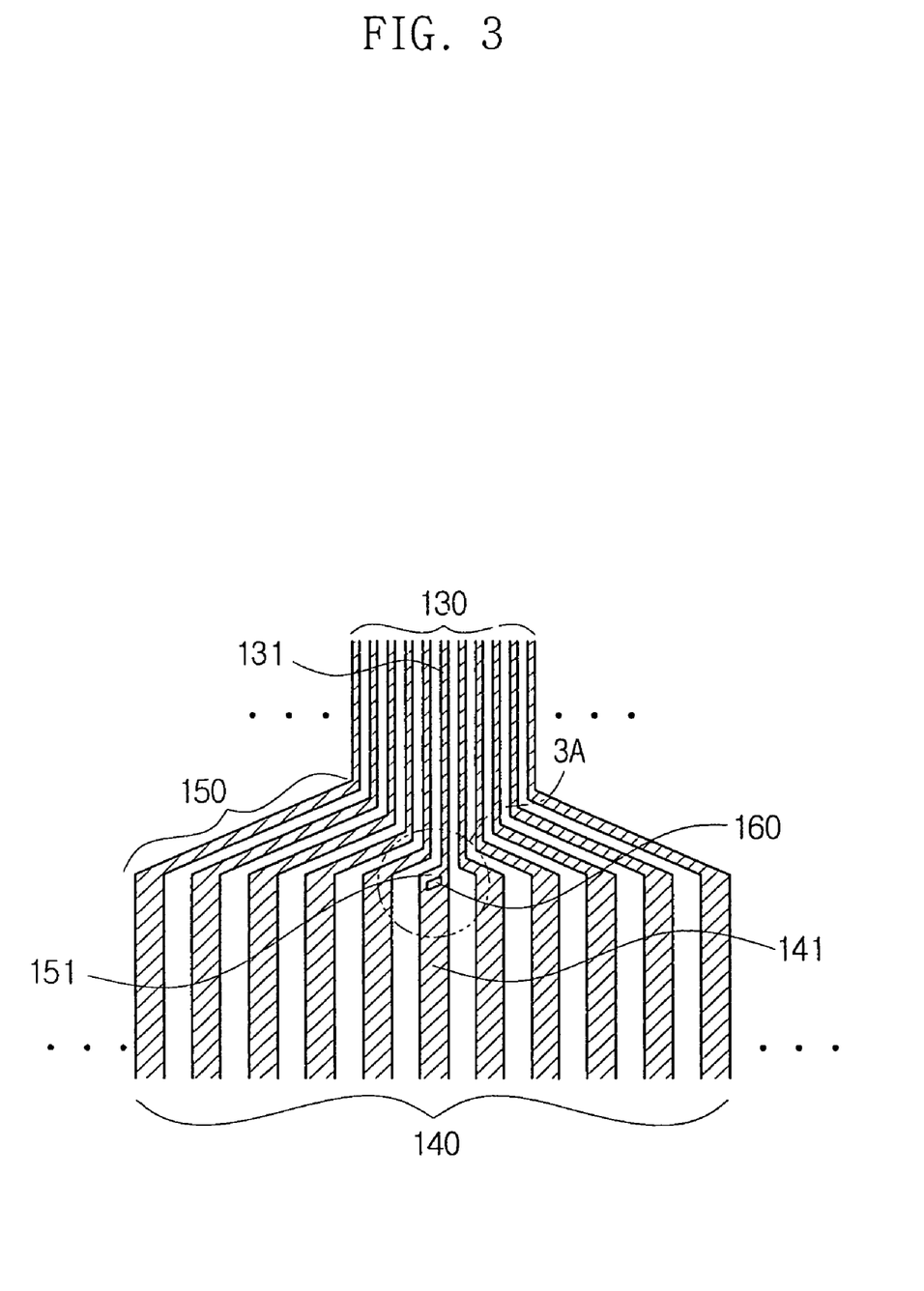
FIG. 3 is a plan view of portion of wiring patterns of a TAB tape for a tape carrier package in accordance with an example embodiment of the present invention.

FIG. 3 is a plan view of a portion of wiring patterns of a TAB tape that may be implemented in a tape carrier package in accordance with an example embodiment of the present invention. The TAB tape may have an opening 160 provided in a connection portion 150.

Referring to FIG. 3, wiring patterns of the TAB tape may include first leads 130, second leads 140, and connection portions 150 connecting the first leads 130 to the second leads 140. The width and pitch of the first lead 130 may be smaller than the width and pitch of the second lead 140. Thus, the connection portions 150 may provide a transition between the first and the second leads 130, 140, respectively.

The wiring patterns may be formed by providing a conductive film on a base film (not shown), for example a polyimide film. In this example embodiment, the conductive film may be a Cu film. The Cu film may be provided via a laminating method and/or an electroplating method, for example. The Cu film may be patterned via a photo etching process, for example, to form the wiring patterns.

The laminating method may involve press rolling Cu film on the base film using heat and pressure. The electroplating method may involve depositing a Cu seed layer on the base film, placing the Cu seed layer in an electrolyte containing Cu, and applying electricity to the electrolyte. Numerous and varied laminating and electroplating techniques, which are well known in this art, may be suitably implemented to fabricate the wiring patterns.

The first leads 130 may be connected to the second leads 140 via the connection portions 150. The connection portions 150 may include a shortest connection portion 151 that may have the shortest length. The first leads 130 may include the first lead 131 that may be connected to the shortest connection portion 151, and the second leads 140 may include the second lead 141 that may be connected to the shortest connection portion 151.

An opening 160 (or hole) may be provided in the shortest connection portion 151 and the second lead 141. The opening 160 may effectively reduce the change of width in the shortest connection portion 151 from the first lead 131 to the second lead 141. In this way, the opening 160 may (for example) reduce the likelihood that stresses may be concentrated on the shortest connection portion 151.

The opening 160 may be provided when the wiring patterns are formed. For example, a photo etching process may be carried out on the Cu film to provide the wiring patterns and the opening 160.

Figure 3A:
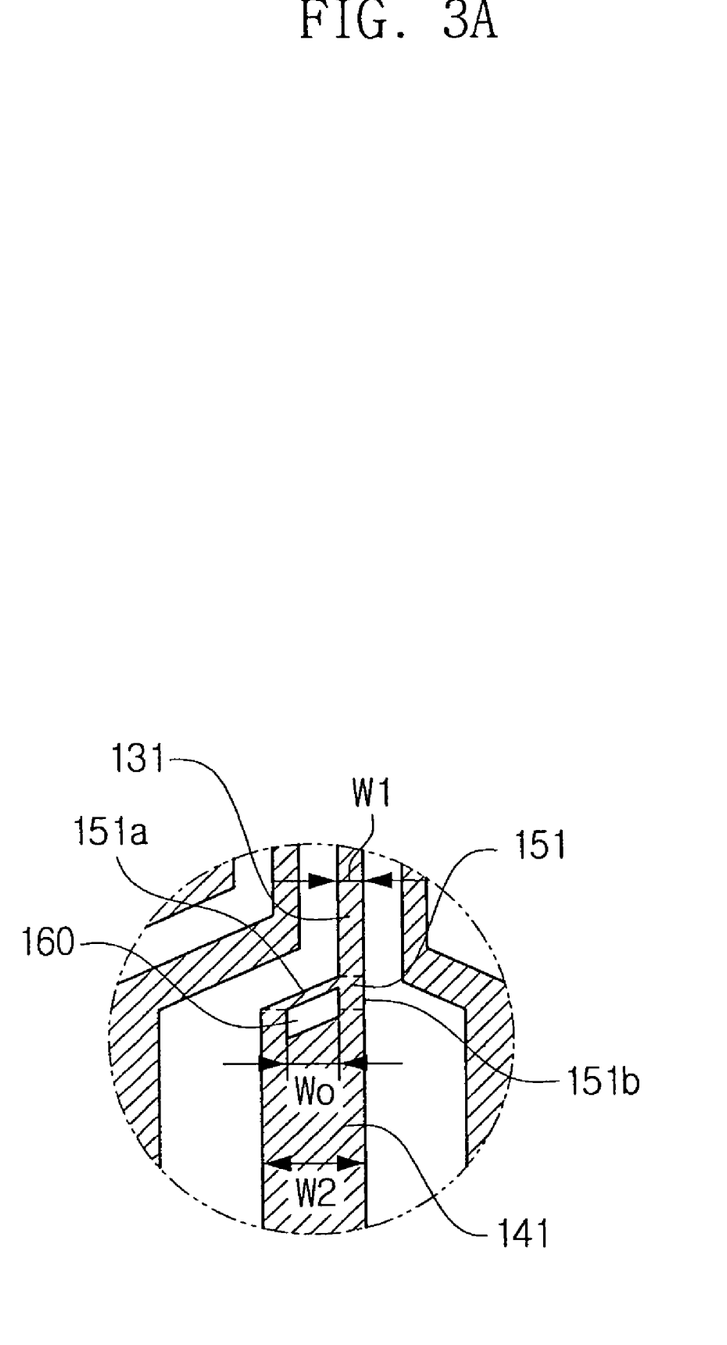
FIG. 3A is an enlarged plan view of section 3A in FIG. 3.

In this example embodiment, and with reference to FIG. 3A, the shortest connection portion 151 may have sides 151a and 151b. The opening 160 may have a polygonal shape, for example a parallelogram. The parallelogram may have opposite parallel sides that may be parallel to the sides 151a and 151b of the shortest connection portion 151. By way of example only, at least one side of the polygonal opening 160 may be parallel to a side of the shortest connection portion 151.

Figure 5:
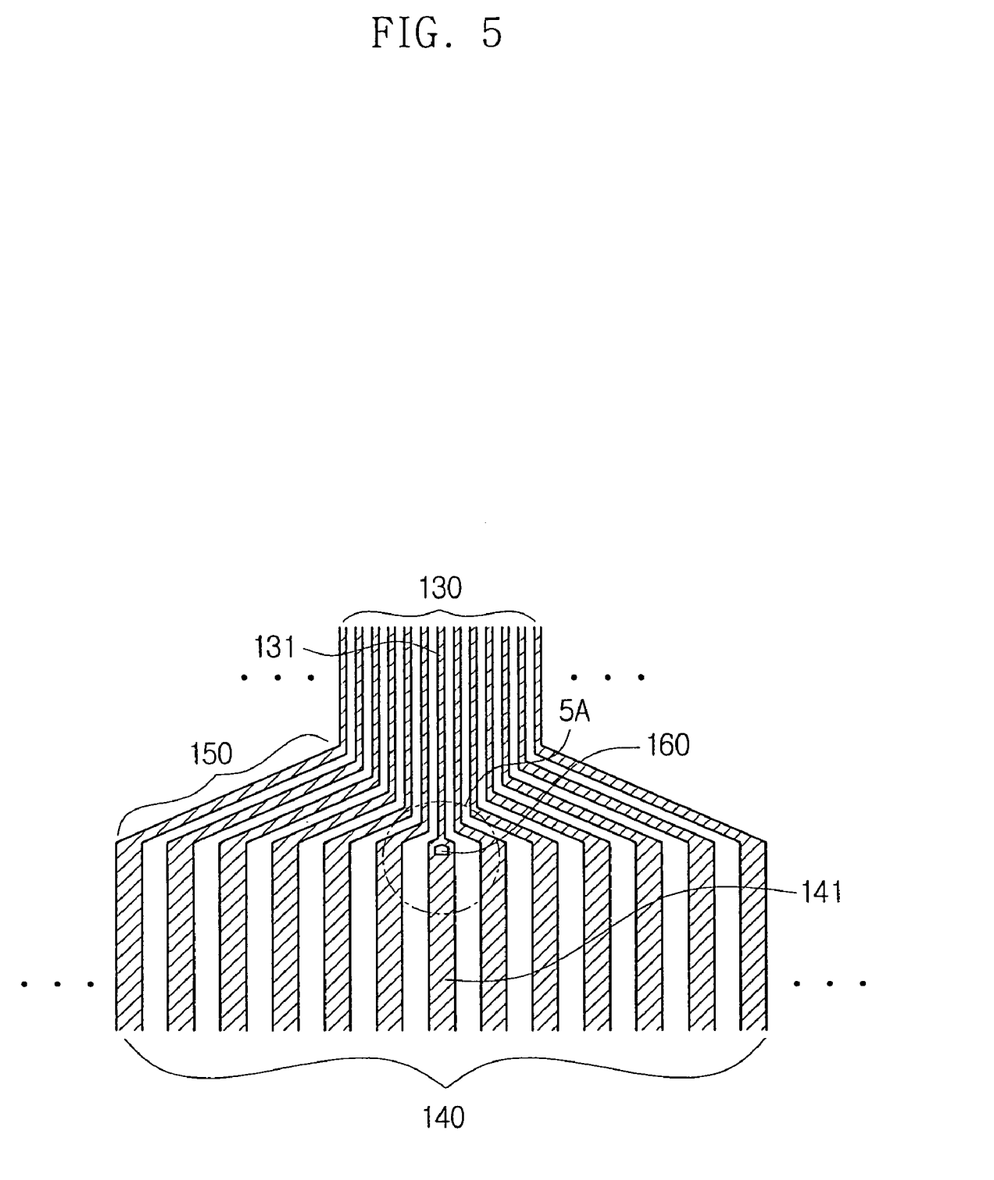
FIGS. 5 through 7 are plan views of openings that may be implemented in a TAB package for a tape carrier package according to example embodiments of the present invention.
Figure 6:
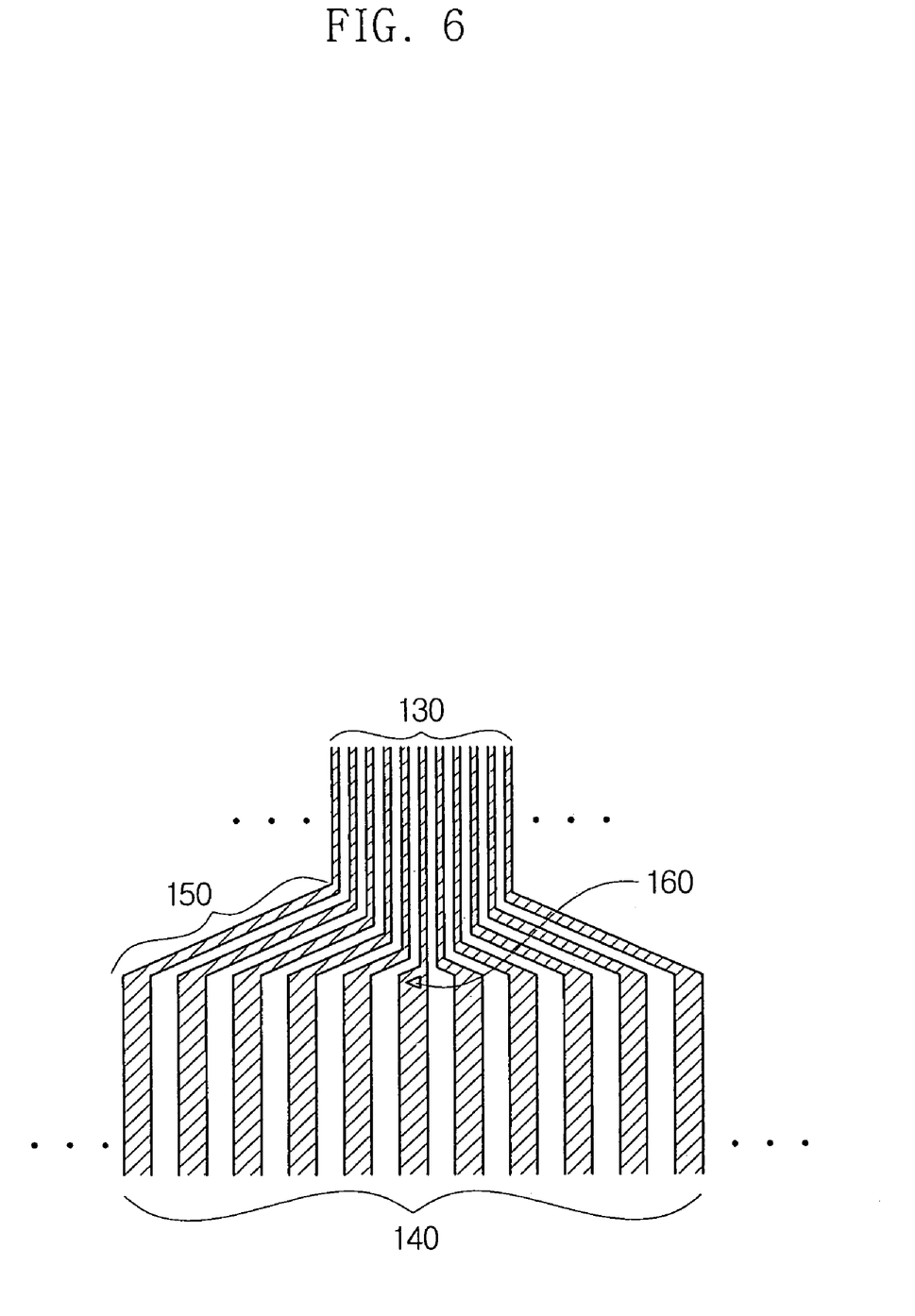
Figure 7:
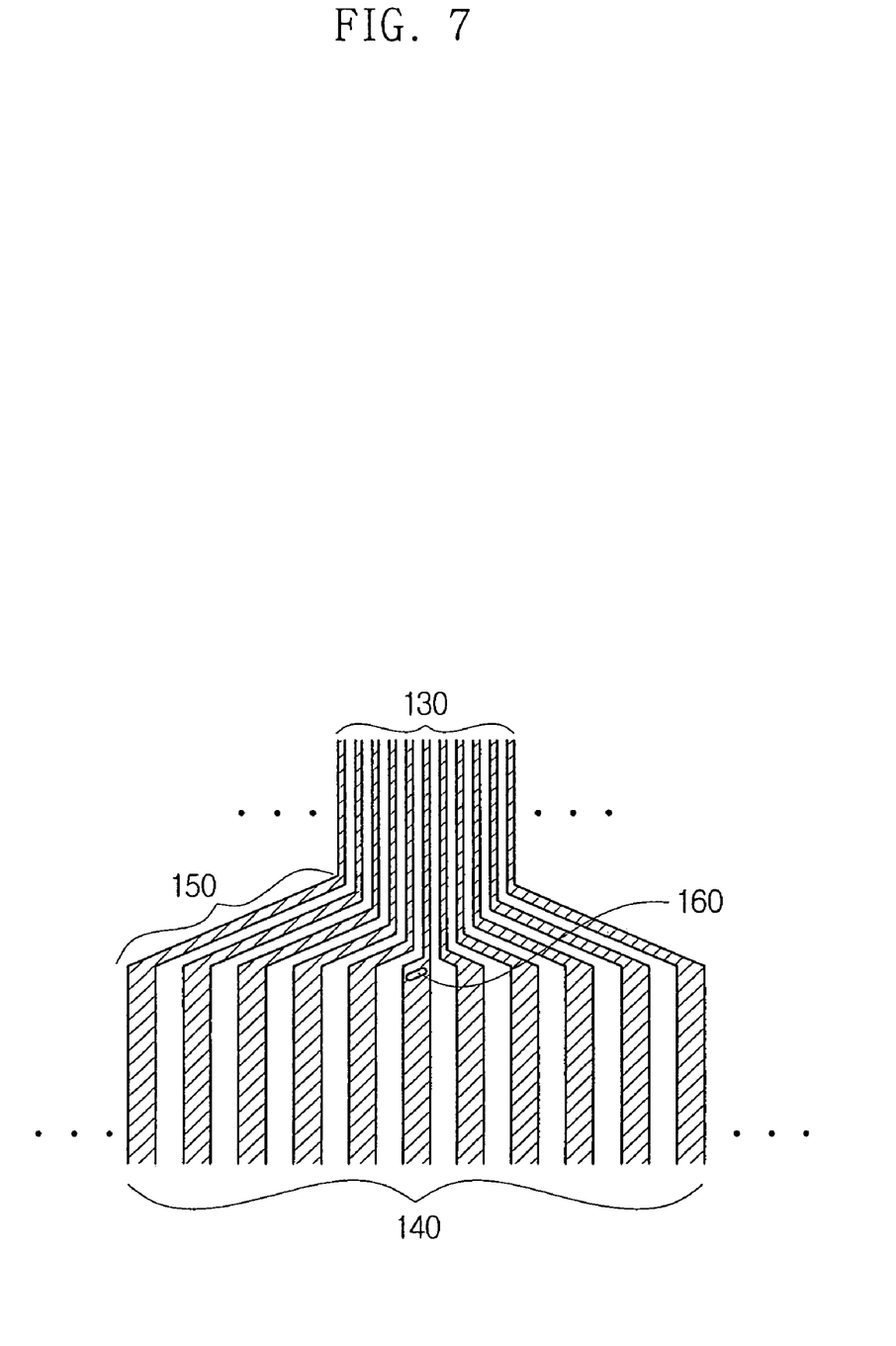

In this example embodiment, a parallelogram-shaped opening 160 may be implemented. In alternative embodiments, the opening 160 may have the shape of a pentagon, as shown in 5, of a triangle as shown in FIG. 6, and of an oval as shown in FIG. 7. The opening may also have a circular shape. It will be readily apparent that the opening may have any geometric shape having any number of sides that may be curved or straight. Also, more than one opening may be provided in the shortest connection portion.

The amount of the lead width change in the shortest connection portion 151 from the first lead 131 to the second lead 141 may be reduced by virtue of the opening 160.

For example, and with reference to FIG. 3A, the width of the first lead 131 may be W1, the width of the second lead 141 may be W2 and the width of the opening 160 may be Wo. The opening 160 may be arranged near the boundary (indicated in phantom) between the first lead 131 and the shortest connection portion 151, thereby creating a transitional lead width of W2-Wo. In this way, the lead width may be more gradually changed from W1 to W2 through the transitional lead width.

The opening 160 may extend from the shortest connection portion 151 to the second lead 141, and therefore stresses that may applied to the shortest connection portion 151 may be dissipated in different directions. Each of the shortest connection portion 151 and a portion of the second lead 141 may be divided into two parts by virtue of the opening 160. Accordingly, the likelihood that leads may be broken due to mechanical shocks (for example) may be reduced.

Figure 5A:
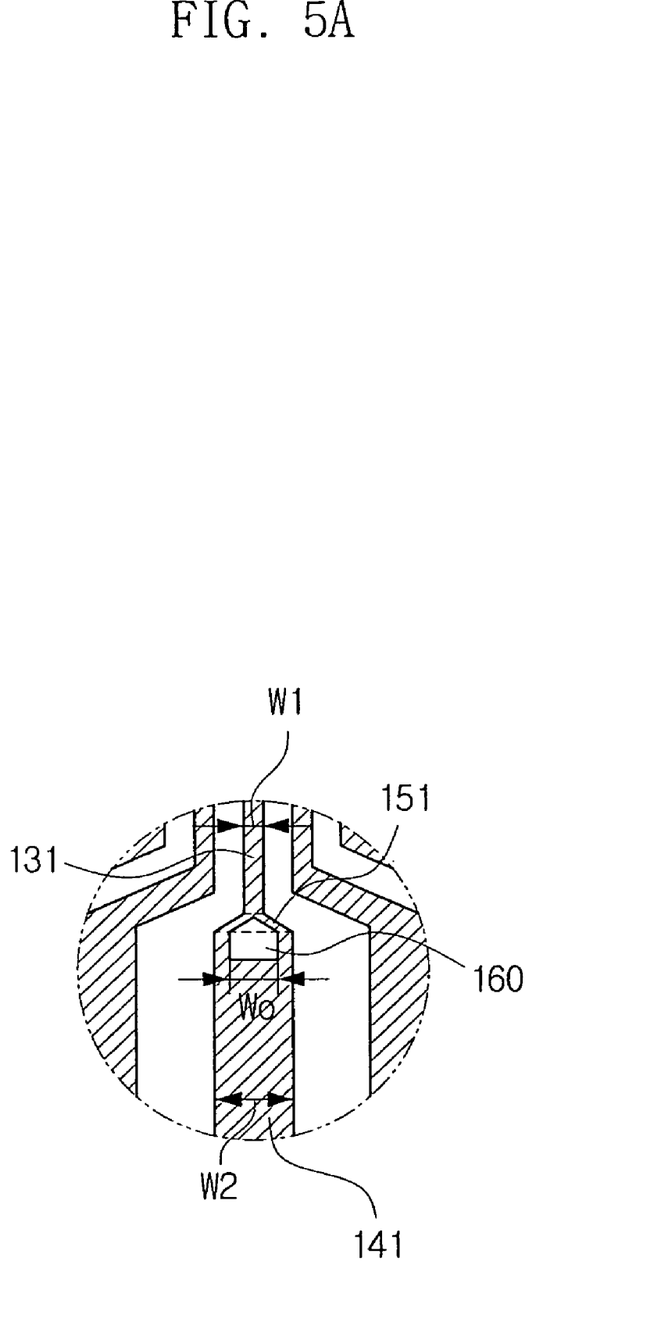

In this example embodiment, a side of the first lead 131 and a side of the second lead 141 may be arranged in a straight line. However, example embodiments of the invention may be not limited in this regard. For example, the center line of the first lead 131 may be parallel to the center line of the second lead 141, as shown in FIGS. 5 and 5A. Here, the wiring patterns may be symmetrical relative to a center line that may be perpendicular to the major axis of the chip mounting area. In alternative embodiments, the sides of the first lead and the second lead (which may be connected to the shortest connection portion) may be offset from each other, and the wiring patterns may be asymmetrical relative to the center line.

One or more openings may be provided in the shortest connection portion of the input wiring patterns and/or the output wiring patterns.

Figure 4:
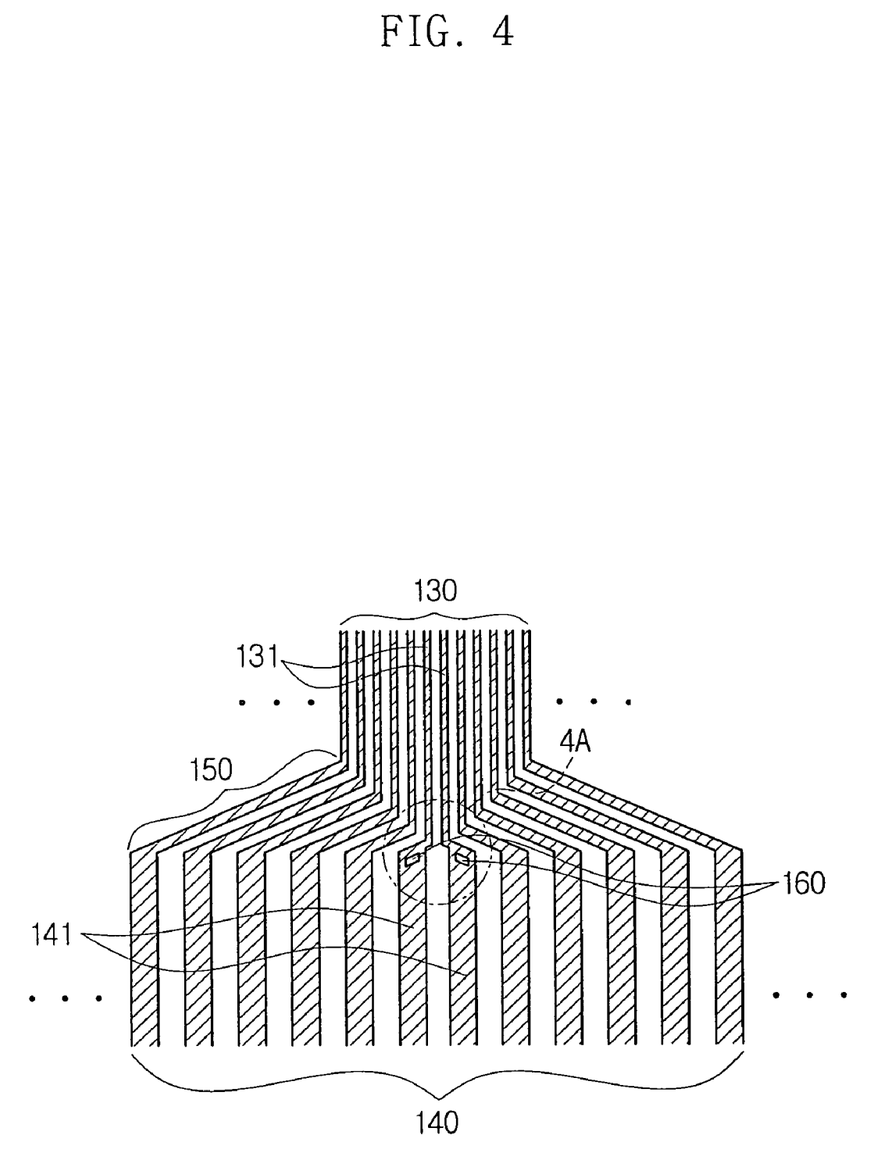
FIG. 4 is a plan view of a portion of wiring patterns of a TAB tape for a tape carrier package in accordance with another example embodiment of the present invention.
Figure 4A:
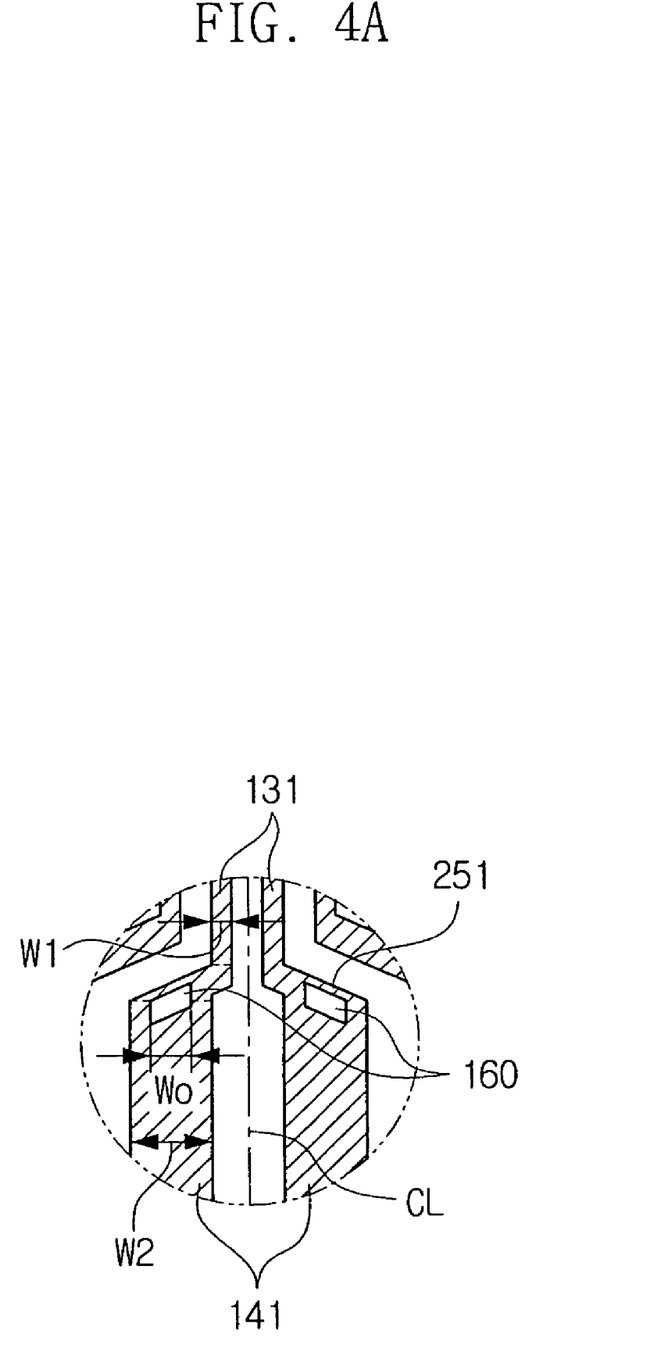
FIG. 4A is an enlarged plan view of section 4A in FIG. 4.

FIG. 4 is a plan view of a portion of wiring patterns of a TAB tape for a tape carrier package in accordance with another example embodiment of the present invention. FIG. 4A is an enlarged plan view of section 4A in FIG. 4.

Referring to FIGS. 4 and 4A, the wiring patterns may have a pair of shortest connection portions 251. The shortest connection portions 251 may be provided on opposite sides of a center line CL (indicated in phantom) that may be perpendicular to the major axis of the chip mounting area (e.g., 2 of FIG. 1).

Each of the shortest connection portions 251 may connect a first lead 131 to a second lead 141. An opening 160 may be provided in each of the shortest connection portions 251 and each of the second leads 141. Each opening 160 may be located near the boundary (indicated in phantom) between the first leads 131 and the shortest connection portions 251.

In this example embodiment, one side of the first lead 131 and one side of the second lead 141 may not be arranged in a straight line. In alternative embodiments, one side of the first lead 131 and one side of the second lead 141 may be arranged in a straight line, as shown in FIGS. 3 and 3A, for example.

The openings 160 may dissipate stresses that may be concentrated on the shortest connection portion 251, and may reduce the likelihood that leads may be broken due to mechanical shocks, for example.

The relationship between the widths of first leads and the widths of second leads may not be limited to a specific example. Even a relatively small difference in widths between the first leads and the second leads may result in a stress concentration phenomenon at a shortest connection portion. The openings according to example embodiments of the present invention may be effective in reducing the stress concentration phenomenon, even if the width of the first leads is at least twice as great as the width of the second leads.

By way of example only, the first leads may have a width of 50 μm.

In accordance with example embodiments of the present invention, a TAB tape for a tape carrier package may have a reduced stress concentration phenomenon without increasing the length of connection portions and/or without increasing the widths of first leads.

Further, the TAB tape for a tape carrier package may have wiring patterns which may accommodate a miniaturized and reliable semiconductor device.

Example, non-limiting embodiments of the present invention have been described. It will be understood that many variations and/or modifications of the basic inventive concepts, which may appear to those skilled in the art, will fall within the spirit and scope of the present invention as defined by the appended claims.

What is claimed is:

1. A TAB tape, comprising:
   a base film having a chip mounting area; and
   wiring patterns provided on the base film, the wiring patterns including a first lead of a first width, a second lead of a second width, and a connection portion connecting the first lead to the second lead, the connection portion having a gradual change in width that connects the first lead and the second lead,
   wherein at least one opening is provided in the connection portion and a portion of the second lead connected to the connection portion, and the at least one opening is surrounded by the connection portion and a portion of the second lead connected to the connection portion.

2. The tape of claim 1, wherein one side of the second lead that is connected to the connection portion and one side of the first lead that is connected to the connection portion are arranged in a straight line.

3. The tape of claim 1, wherein a line extending from one side of the first lead connected to the connection portion is in a portion of the second lead connected to the connection portion.

4. The tape of claim 3, wherein the wiring patterns are substantially symmetrical relative to a center line that is perpendicular to a major axis of the chip mounting area.

5. The tape of claim 1, wherein the second width is wider than the first width.

6. The tape of claim 1, wherein the at least one opening has a polygonal shape.

7. The tape of claim 1, wherein at least one side of the at least one opening is parallel to one side of the connection portion.

8. The tape of claim 1, wherein at least one side of the at least one opening is parallel to one side of second lead.

9. A TAB tape, comprising:
   a base film having a chip mounting area; and
   wiring patterns provided on the base film, the wiring patterns including a plurality of first leads of a first width, a plurality of second leads of a second width, and a plurality of connection portions connecting the first leads to the second leads, the connection portions including a pair of shortest connection portions, the connection portions having a gradual change in width that connects the respective first leads and the respective second leads,
   wherein at least one opening is provided in each of the shortest connection portions and a portion of each of the second leads connected to the shortest connection portions, and
   wherein the at least one opening is surrounded by the shortest connection portion and a portion of the second lead connected to the shortest connection portion.

10. The tape of claim 9, wherein the wiring patterns are substantially symmetrical relative to a center line.

11. The tape of claim 9, wherein one side of the second lead that is connected to the shortest connection portion and one side of the first lead that is connected to the shortest connection portion are arranged in a straight line.

12. A wiring substrate, comprising:
a base;
a plurality of parallel first leads provided on the base at a first pitch;
a plurality of parallel second leads provided on the base at a second pitch, wherein the plurality of second leads have larger widths than the plurality of first leads; and a plurality of connection portion connecting the plurality of first and the second leads respectively, the connection portions having a gradual change in width that connects the respective first leads and the respective second leads,
wherein at least one opening is provided in one of the plurality of connection portion, and the at least one opening being surrounded by the plurality of connection portions.

13. The wiring substrate of claim 12, wherein the at least one opening extends into one of the plurality of second lead that is connected to the shortest one of the plurality of connection portions.

14. The wiring substrate of claim 12, wherein at least one side of the at least one opening is parallel to one side of the plurality of connection portion.

15. The wiring substrate of claim 12, wherein at least one side of the at least one opening is parallel to one side of plurality of second lead.

16. The wiring substrate of claim 12, wherein the plurality of first leads are parallel to the plurality of second leads.

* * * * *